United States Patent [19]
Klemmer

[11] Patent Number: 6,100,758
[45] Date of Patent: Aug. 8, 2000

[54] LOW NOISE RESISTIVELY MATCHED AMPLIFIER

[75] Inventor: Nikolaus Klemmer, Apex, N.C.

[73] Assignee: Ericsson Inc., Research Triangle Park, N.C.

[21] Appl. No.: 09/208,142

[22] Filed: Dec. 9, 1998

[51] Int. Cl.[7] ........................................................ H03F 3/45
[52] U.S. Cl. .......................................... 330/252; 330/254
[58] Field of Search .................................... 330/252, 253, 330/254, 261; 327/359

[56] References Cited

U.S. PATENT DOCUMENTS

| | | | |
|---|---|---|---|
| 4,365,206 | 12/1982 | Rehfeldt | 330/260 |
| 4,887,047 | 12/1989 | Somerville | 330/257 |
| 5,877,643 | 3/1999 | Drogi | 327/256 |
| 5,999,049 | 12/1999 | Katakura | 330/252 |

*Primary Examiner*—Benny Lee
*Assistant Examiner*—Henry Choe
*Attorney, Agent, or Firm*—Wood, Phillips, VanSanten, Clark & Mortimer

[57] ABSTRACT

In a communication transceiver receiving a signal from a signal source defined by a source impedance between first and second nodes, an amplifier is provided having an input impedance matched to the source impedance. The amplifier includes a transconductance cell having first and second transistors connected to the first and second nodes, respectively. The first and second transistors of the transconductance cell receive the signal from the signal source and develop a modified version of the signal as an output current signal at first and second output terminals, respectively. A first impedance circuit, having a first impedance related to the input impedance, is connected between the second node and the first transistor. Similarly, a second impedance circuit, having a second impedance related to the input impedance, is connected between the first node and the second transistor.

25 Claims, 6 Drawing Sheets

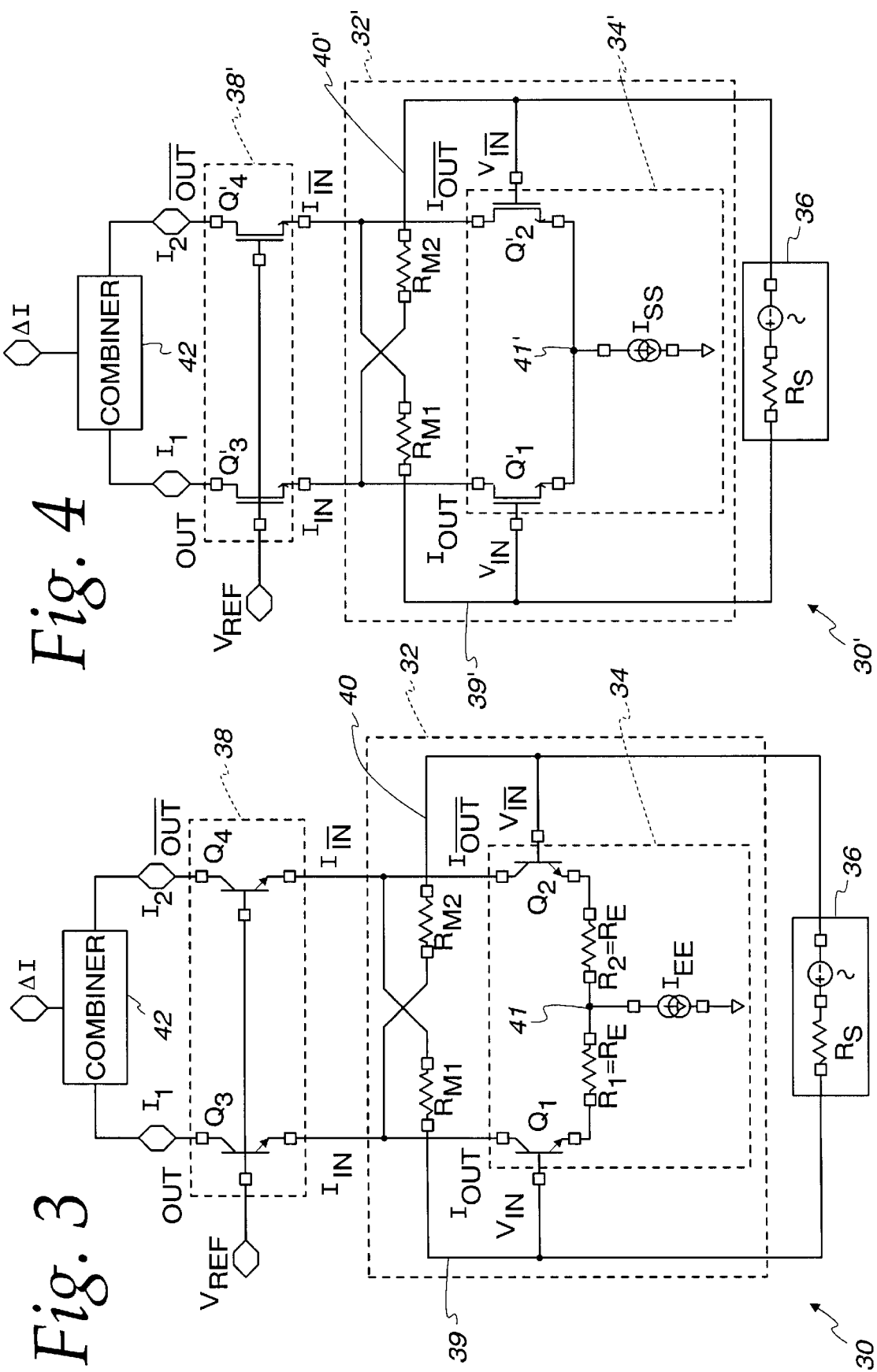

LOW NOISE RESISTIVELY MATCHED AMPLIFIER

FIELD OF THE INVENTION

The present invention is directed toward amplifiers utilized in communication transceivers and, more particularly, toward a low noise, power-matched amplifier.

BACKGROUND OF THE INVENTION

Amplifiers are typically used in communication transceivers for the amplification of weak electrical signals. Two main concerns associated with amplifier design are: (1) the minimization of noise added to the signal by the amplifier; and (2) achieving maximum power transfer between a source producing the signal and the amplifier.

In order to achieve maximum power transfer between the source and the amplifier, the input impedance ($Z_{IN}$) of the amplifier must be equal to the complex conjugate of the source output impedance ($Z_S$), namely, $Z_{IN}=Z_S'$. In the case where the output impedance of the source is real ($Z_S=R_S$), then the input impedance of the amplifier must also be real ($Z_{IN}=R_{IN}$). For maximum power transfer between the source and the amplifier, $R_{IN}=R_S$. This is commonly referred to as "power-matching".

The noise added to the signal by the amplifier results in a degradation of the signal-to-noise ratio (S/N) at the output of the amplifier. A figure of merit for the amount of noise added by the amplifier is the ratio of the signal-to-noise ratio at the input $(S/N)_{IN}$ to the signal-to-noise ratio at the output of the amplifier $(S/N)_{OUT}$. This ratio is commonly referred to as the noise factor (F) of the amplifier, and is used to calculate the noise figure (NF) of the amplifier according to the formula NF=10 $\log_{10}(F)$, where $F=(S/N)_{IN}/(S/N)_{OUT}$.

Typically, amplifiers are integrated as monolithic ASICs (Application Specific Integrated Circuits). Maintaining a power-matched condition very accurately over production tolerances of the components that are used in the amplifier has traditionally been difficult. This especially presents a problem when the power-matched amplifier is used at the output of a filter, e.g., crystal filter, SAW filter, etc., whose components typically have a high sensitivity with respect to changes in the source output and termination (amplifier input) impedances. Accordingly, maintaining a proper power-matched input impedance of the amplifier following the filter over temperature and process spread of the components, while at the same time minimizing the noise figure of the amplifier, is critical for the overall performance of the system in which these components are utilized. Generally, an improvement in one area has resulted in a penalty in the other area.

The present invention is directed toward overcoming one or more of the above-mentioned problems.

SUMMARY OF THE INVENTION

In a communication transceiver receiving a signal from a signal source defined by a source impedance between first and second nodes, an amplifier is provided having an input impedance matched to the source impedance. The amplifier includes a transconductance cell having first and second transistors connected to the first and second nodes, respectively. The first and second transistors of the transconductance cell receive the signal from the signal source and develop a modified version of the signal as an output current signal at first and second output terminals, respectively. A first impedance circuit, having a first impedance related to the input impedance, is connected between the second node and the first transistor. Similarly, a second impedance circuit, having a second impedance related to the input impedance, is connected between the first node and the second transistor.

In one form, the transconductance cell includes a differential amplifier receiving the signal from the signal source and developing a differential output current signal at the first and second output terminals.

In a first embodiment of the inventive amplifier, the first and second transistors each include control, output and supply elements. The control elements of the first and second transistors are connected to the first and second nodes, respectively. The output elements of the first and second transistors correspond to the first and second output terminals, respectively. The first impedance circuit is connected between the second node and the output element of the first transistor. Similarly, the second impedance circuit is connected between the first node and the output element of the second transistor.

In one form of the first embodiment, the source impedance includes a source resistance $R_S$, the first impedance includes a first resistance $R_1$, and the second impedance includes a second resistance $R_2$. Preferably, $R_1+R_2=R_S$, with $R_1=R_2$.

In another form of the first embodiment, a current collector circuit is connected to the first and second output terminals. The current collector circuit combines the output current signal at the first and second output terminals with current signals from the first and second impedance circuits, respectively, and develops a combined output current signal at respective output terminals thereof.

More specifically, the current collector circuit includes third and fourth transistors, each having control, output and supply elements. The supply elements of the third and fourth transistors are connected to the first and second output terminals, respectively. The third and fourth transistors of the current collector circuit develop the combined output current signal at the output elements thereof. Preferably, the third and fourth transistors each have unity current gain.

In yet another form of the first embodiment, the first through fourth transistors include bipolar junction transistors having base, collector and emitter elements corresponding to the control, output and supply elements, respectively.

In still another form of the first embodiment, the first through fourth transistors include field effect transistors having gate, drain and source elements corresponding to the control, output and supply elements, respectively.

In a second embodiment of the inventive amplifier, the first and second transistors each include control, output and supply elements. The control elements of the first and second transistors are connected to the first and second nodes, respectively. The output elements of the first and second transistors correspond to the first and second output terminals, respectively. The first impedance circuit is connected between the second node and the supply element of the first transistor. Similarly, the second impedance circuit is connected between the first node and the supply element of the second transistor.

In one form of the second embodiment, the source impedance includes a source resistance $R_S$, the first impedance includes a first resistance $R_1$, and the second impedance includes a second resistance $R_2$. In a preferred form, $R_1=R_2=R_S$.

In another form of the second embodiment, the first impedance circuit includes a first DC block capacitor.

Similarly, the second impedance circuit includes a second DC block capacitor.

In yet another form of the second embodiment, the first and second transistors include bipolar junction transistors having base, collector and emitter elements corresponding to the control, output and supply elements, respectively.

In still another form of the second embodiment, the first and second transistors include field effect transistors having gate, drain and source elements corresponding to the control, output and supply elements, respectively.

An object of the present invention is to provide an amplifier with a very well controlled input impedance.

A further object of the present invention is to provide an amplifier having an input impedance that does not significantly vary over temperature and process spread of amplifier components.

A further object of the present invention is to reduce the noise figure associated with a power-matched amplifier.

A further object of the present invention is to provide a low noise figure, power-matched amplifier while minimizing the impact on the current consumption of the amplifier.

Other aspects, objects and advantages of the present invention can be obtained from a study of the application, the drawings, and the appended claims.

BRIEF DESCRIPTION OF THE DRAWINGS

FIG. 3 illustrates a detailed implementation of the inventive amplifier circuit shown in FIG. 2 utilizing bipolar junction transistors;

FIG. 4 illustrates a detailed implementation of the inventive amplifier circuit shown in FIG. 2 using field effect transistors;

DETAILED DESCRIPTION OF THE PREFERRED EMBODIMENTS

Figure 1:
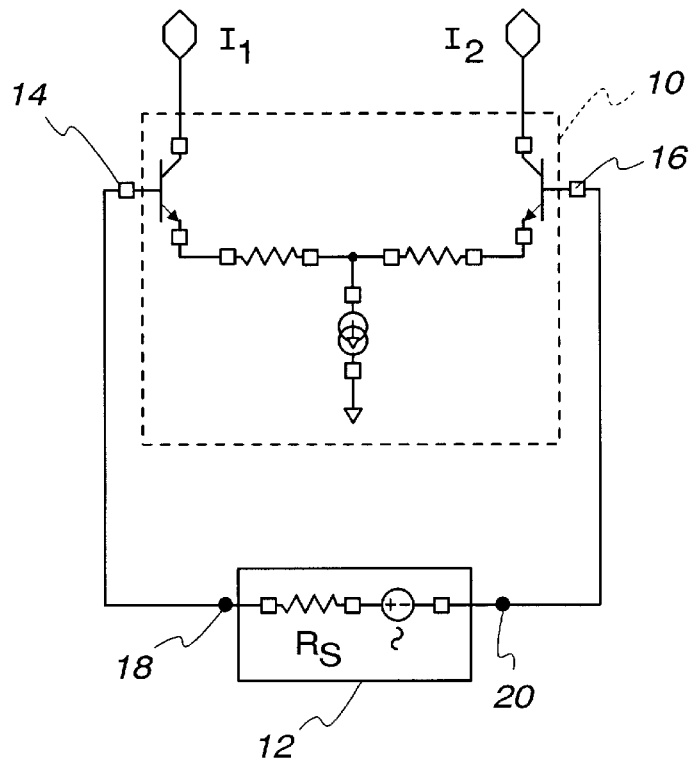
FIG. 1 illustrates a prior art differential amplifier circuit.

Differential amplifiers with power-matched input resistances $R_{IN}$ are commonly used in the input stages of intermediate frequency (IF) amplifiers in superheterodyne receivers. FIG. 1 illustrates a prior art differential amplifier 10 driven by a signal source 12. Assuming the source 12 is a typical channel selection filter, the input impedance of the amplifier 10 must be well defined, or otherwise the properties of the channel selection filter (mainly bandwidth and group delay distortion) will vary and degrade the performance of the receiver. The input resistance $R_{IN}$ of the differential amplifier 10 is the resistance seen by the source 12 across the amplifier input nodes 14 and 16. The source resistance $R_S$ is the resistance across the source nodes 18 and 20. In the case of a filter, the source resistance $R_S$ will be known, i.e., provided by the filter manufacturer.

The prior art differential amplifier 10 has various disadvantages. First, the input resistance $R_{IN}$ is very high, typically along the lines of 10–100 k$\Omega$. The source resistance $R_S$ of the source 12, typically a filter, is generally much less, typically along the lines of 100–1,000$\Omega$. Accordingly, achieving the power-matched condition of $R_{IN}=R_S$ is very difficult.

A further disadvantage of the prior art differential amplifier 10 is that the input resistance $R_{IN}$ of the amplifier 10 is dependent on the various component tolerances. For low frequencies, $R_{IN}$ can vary between 0.56–1.8 times its nominal value. This makes power-matching even more difficult, especially in volume production circumstances.

A still further disadvantage of the prior art differential amplifier 10 is that the signal level input to the amplifier 10 changes by a factor of $\sqrt{(R_{IN}/R_S)}$. If $R_{IN}$ varies significantly, so will the signal level at the input nodes 14,16 of the amplifier 10. This results in an unpredictable distortion level at the output.

A common solution to the above-identified problems is to add a matching resistor $R_M$ (not shown) in parallel with both the amplifier 10 and the source 12. To achieve a power-matched condition, $R_M$ is made equal to $R_S$. Since $R_M$ is generally much less than the input resistance of $R_{IN}$ of the amplifier 10, the parallel combination of $R_M$ and $R_{IN}$ is approximately equal to $R_M$. However, the addition of $R_M$ reduces the signal-to-noise ratio at the output of the amplifier 10 $(S/N)_{OUT}$, which results in a noise figure unacceptable for many applications.

Figure 2:
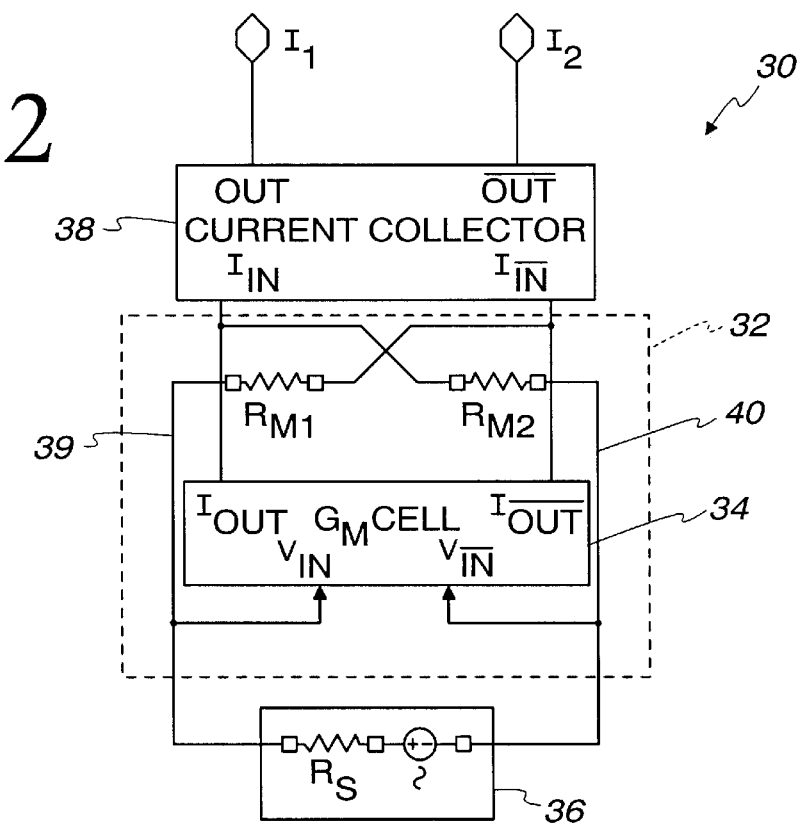
FIG. 2 is a block diagram of an amplifier circuit according to the present invention.

FIG. 2 illustrates a block diagram of the inventive amplifier topology, shown generally at 30, which overcomes the above-identified problems. The inventive circuit 30 includes an amplifier circuit 32 having a $G_M$ cell 34 receiving a voltage signal from a source 36 and developing an output current signal at nodes $I_{OUT}, \overline{I_{OUT}}$. A current collector circuit 38 receives the current signal output from the amplifier circuit 32 and develops an output current signal $I_1, I_2$ at nodes OUT,$\overline{OUT}$. The amplifier circuit 32 includes resistors $R_{M1}$ and $R_{M2}$ wrapped around the $G_M$ cell 34 defining feedforward loops 39 and 40, respectively. The feedforward loops 39 and 40 transfer some of the current flowing from the source 36 to the output of the amplifier circuit 32. Accordingly, since the noise associated with the $G_M$ cell 34 will generally not change, increasing the signal at its output increases the signal-to-noise ratio at the output of the amplifier circuit 32, and thus improves the noise figure associated with the amplifier circuit 32.

FIG. 3 illustrates a detailed implementation of the inventive amplifier topology 30 shown in FIG. 2. The $G_M$ cell 34 includes a typical differential amplifier including transistors $Q_1$ and $Q_2$, resistors $R_1$ and $R_2$, and a current source $I_{EE}$. The bases of transistors $Q_1$ and $Q_2$ correspond to the input terminals $V_{IN}$ and $V_{\overline{IN}}$ of the $G_M$ cell 34. The collectors of transistors $Q_1$ and $Q_2$ correspond to the output terminals $I_{OUT}$ and $I_{\overline{OUT}}$ of the $G_M$ cell 34. The resistors $R_1$ and $R_2$ are series connected between the emitters of transistors $Q_1$ and $Q_2$, with the current source $I_{EE}$ connected between a node 41, defined by the junction between the resistors $R_1$ and $R_2$, and ground. The resistors $R_1$ and $R_2$ are typically referred to as degeneration resistors, and in the most common implementation, $R_1=R_2=R_E$.

The current collector 38 includes transistors $Q_3$ and $Q_4$ connected in a common-base topology. A reference voltage source $V_{REF}$ applies a reference voltage to the bases of transistors $Q_3$ and $Q_4$, which, in a preferred form, have unity gain. The emitters of transistors $Q_3$ and $Q_4$ correspond to the input terminals $I_{IN}$ and $I_{\overline{IN}}$ of the current collector 38. The collectors of the transistors $Q_3$ and $Q_4$ correspond to the output terminals OUT and $\overline{OUT}$ of the current collector 38. The resistor $R_{M1}$ is connected between nodes $V_{IN}$ and $I_{\overline{IN}}$. For symmetry reasons, the resistor $R_{M2}$ is connected between nodes $V_{\overline{IN}}$ and $I_{IN}$. Preferably, due to the symmetry of the circuit: $R_{M1}=R_{M2}=R_M$. The collectors of transistors $Q_3$ and $Q_4$ are connected to a DC voltage source $V_{CC}$ (not shown) which, along with the current source $I_{EE}$, establishes a DC bias current through transistors $Q_1$, $Q_2$, $Q_3$ and $Q_4$. Operation of the inventive circuit 30 is as follows.

The source 36 is preferably a filter generally utilized in communication transceivers. The filter 36 will have associated with it an output resistance $R_S$, the value of which is generally provided by the filter manufacturer. The current collector 38 generally has an input impedance close to zero Ohms, and accordingly, the voltage swing at the emitters of transistors $Q_3$ and $Q_4$ is negligible. The current that flows out of the source 36 will flow from resistor $R_S$ through resistor $R_{M1}$ and into the emitter of transistor $Q_4$ at node $I_{\overline{IN}}$. To complete the current loop, the current flowing from the emitter of transistor $Q_3$ at node $I_{IN}$ will flow through resistor $R_{M2}$ and back into the source 36. The total input resistance $R_{IN}$ of the current loop is $R_{M1}+R_{M2}$. The input resistance $R_{IN}$ of the loop can be very well controlled if resistors $R_{M1}$ and $R_{M2}$ are kept off-chip, since discrete resistors generally have much tighter tolerances (typically ±1.0%) than on-chip resistors (typically ±20.0%). Accordingly, a power-matched condition will be achieved if the sum of $R_{M1}+R_{M2}$=the source resistance $R_S$. For symmetry reasons, the preferred choice is $R_{M1}=R_{M2}=Rs/2$. In practice, however, the sum of $R_{M1}+R_{M2}$ will be slightly less than $R_S$, since the input impedance into the current collector, while close to zero, is not exactly zero.

The resistors $R_{M1}$ and $R_{M2}$ are wrapped around the $G_M$ cell 34 and define the current feedforward loops 39 and 40, respectively. This cross-coupled connection of the resistors $R_{M1}$ and $R_{M2}$ is essential for operation of the inventive circuit 30. Assume the voltage increases at the node $V_{IN}$ by $\Delta V/2$. The corresponding output current at the node $I_{OUT}$ will increase by $\Delta I/2$. Since it is assumed that the signal from the source 36 is an AC signal, a voltage increase at the node $V_{IN}$ corresponds to a voltage decrease at the node $V_{\overline{IN}}$ of $\Delta V/2$, and a corresponding current decrease at the node $I_{\overline{OUT}}$ of $\Delta I/2$. Accordingly, the differential output current of the $G_M$ cell 34 is given by $\Delta I=g_m\Delta V$, where $g_m$ denotes the transconductance of the bipolar transistors $Q_1$ and $Q_2$ under DC biasing conditions. In general, $g_m=g_{mo}/(1+g_{mo}R_E)$ with $g_{mo}=I_{EE}/(2V_T)$ for $R_E=0$, where $V_T$ denotes the threshold voltage of transistors $Q_1$ and $Q_2$. For symmetry reasons, the transistors $Q_1$ and $Q_2$ are equally sized.

Upon an increase in voltage at the node $V_{IN}$ by $\Delta V/2$, the current in the feedforward resistor $R_{M1}$ correspondingly increases by $(\Delta V/2)/R_{M1}$. This current increase supplied by the feedforward loop 39 subtracts from the output current at the node $I_{\overline{OUT}}$ of the $G_M$ cell 34. Accordingly, the change in current input to the current collector 38 at the node $I_{\overline{IN}}$ is $(g_m+1/R_{M1})(-\Delta V/2)$. Since transistor $Q_4$ preferably has unity gain, this current change shows up as the output current $I_2$ at node $\overline{OUT}$ of the current collector 38. Similarly, upon a decrease in voltage at the node $V_{\overline{IN}}$ by $\Delta V/2$, the current in the feedforward resistor $R_{M2}$ correspondingly decreases by $(-\Delta V/2)/R_{M2}$. This current decrease supplied by the feedforward loop 40 adds to the output current at the node $I_{OUT}$ of the $G_M$ cell 34. Accordingly, the change in current input to the current collector 38 at node $I_{IN}$ is $(g_m+1/R_{M2})(\Delta V/2)$. Since transistor $Q_3$ preferably has unity gain, this current change shows up as the output current $I_1$ at node OUT of the current collector 38.

The output currents $I_1$ and $I_2$ are conventionally combined by a combiner 42, which takes the difference between output currents $I_1$ and $I_2$ and produces an output current $\Delta I=I_1-I_2$. With the preferred case of $R_{M1}=R_{M2}=R_S/2$, the output differential current $\Delta I$ of the inventive circuit 30 turns out to be $\Delta I=(g_m+2/R_S)\Delta V$. This yields an apparent transconductance of the amplifier circuit 32 to be $(g_m+2/R_S)$. Depending on the value of $g_m$, a significantly higher gain may result than in the prior art shunt matched case shown in FIG. 1 (with the inclusion of $R_M$).

The resistors $R_{M1}$ and $R_{M2}$ in the feedforward paths of the inventive amplifier circuit 32 contribute thermal noise to the output signal. However, as described below, the inventive amplifier circuit 32 cancels part of the noise coming from the resistors $R_{M1}$ and $R_{M2}$, such that their impact on the noise figure of the amplifier circuit 32 is minimized.

Assume, in the preferred case of $R_{M1}=R_{M2}=R_S/2$, that there is an instantaneous noise voltage vn in series with resistor $R_{M1}$. A resultant noise current in will flow in the series connection of the source resistance $R_S$ and the feedforward resistors $R_{M1}$ and $R_{M2}$ equal to $v_n/(2R_S)$. This current will appear as a differential output current at the output nodes OUT,$\overline{OUT}$ of the current collector 38 with an amplitude of $i_{n1}=-2i_n=-v_n/R_S$. The differential noise current $i_n$ also generates a differential voltage equal to $i_n R_S$ across the input nodes $V_{IN}$,$V_{\overline{IN}}$ Of the $G_M$ cell 34. This results in a differential output current passed to the output nodes OUT, $\overline{OUT}$ of the current collector circuit 38 with an amplitude of $i_{n2}=i_n g_m R_S=v_n g_m/2$. Thus, the total instantaneous noise output current due to the noise contribution of $R_{M1}$ is $i_{n,RM1}=i_{n1}+i_{n2}=v_n((g_m/2)-(1/R_S))$. The noise contribution of $R_{M1}$ can be minimized if $g_m$ is chosen equal to $2/R_S$. The same holds true for the noise contribution of resistor $R_{M2}$.

In practice the $G_M$ cell 34 will contribute noise to the output signal, this noise being characterized by its input referred spectral noise voltage density $v_{ni}^2$. This value is generally provided by the manufacturer of the particular $G_M$ cell. However, by appropriately choosing the value for $g_m$, the inventive circuit 30 alleviates some of the noise figure penalty contributed by the $G_M$ cell 34, while still providing a power-matched condition.

The noise contributed by the passive network consisting of resistors $R_{M1}$, $R_{M2}$, $R_1$, $R_2$ and $R_S$ (where $R_1=R_2=R_E$), and the noise contributed by the active network consisting of transistors $Q_1$, $Q_2$, $Q_3$ and $Q_4$, both depend on the ratio $R_E/R_S$. Both noise contributions can be minimized if $R_E$ is chosen to be within the range $R_s/2 \leq R_E \leq 3R_S/2$.

FIG. 4 illustrates an alternative form of the inventive amplifier circuit 30 of FIG. 3, shown generally at 30'. The amplifier circuit 30' is implemented using field effect transistors $Q_1'$, $Q_2'$, $Q_3'$ and $Q_4'$ in place of the bipolar junction transistors $Q_1$, $Q_2$, $Q_3$ and $Q_4$ used in FIG. 3. The operation of the amplifier circuit 30' is the same as previously described with respect to the amplifier circuit 30 shown in FIG. 3, and accordingly, a detailed discussion in not necessitated. The major difference in the amplifier circuit 30' is that the transconductance of the $G_M$ cell 34' for a given tail current $I_{SS}$ can be designed to achieve an optimum value for $g_m$ without the use of degeneration resistors $R_1$ and $R_2$.

Further, while FIGS. 3 and 4 have been shown and described utilizing N-type devices, conversion of the topology such that P-type devices can be utilized is apparent.

Figure 5:
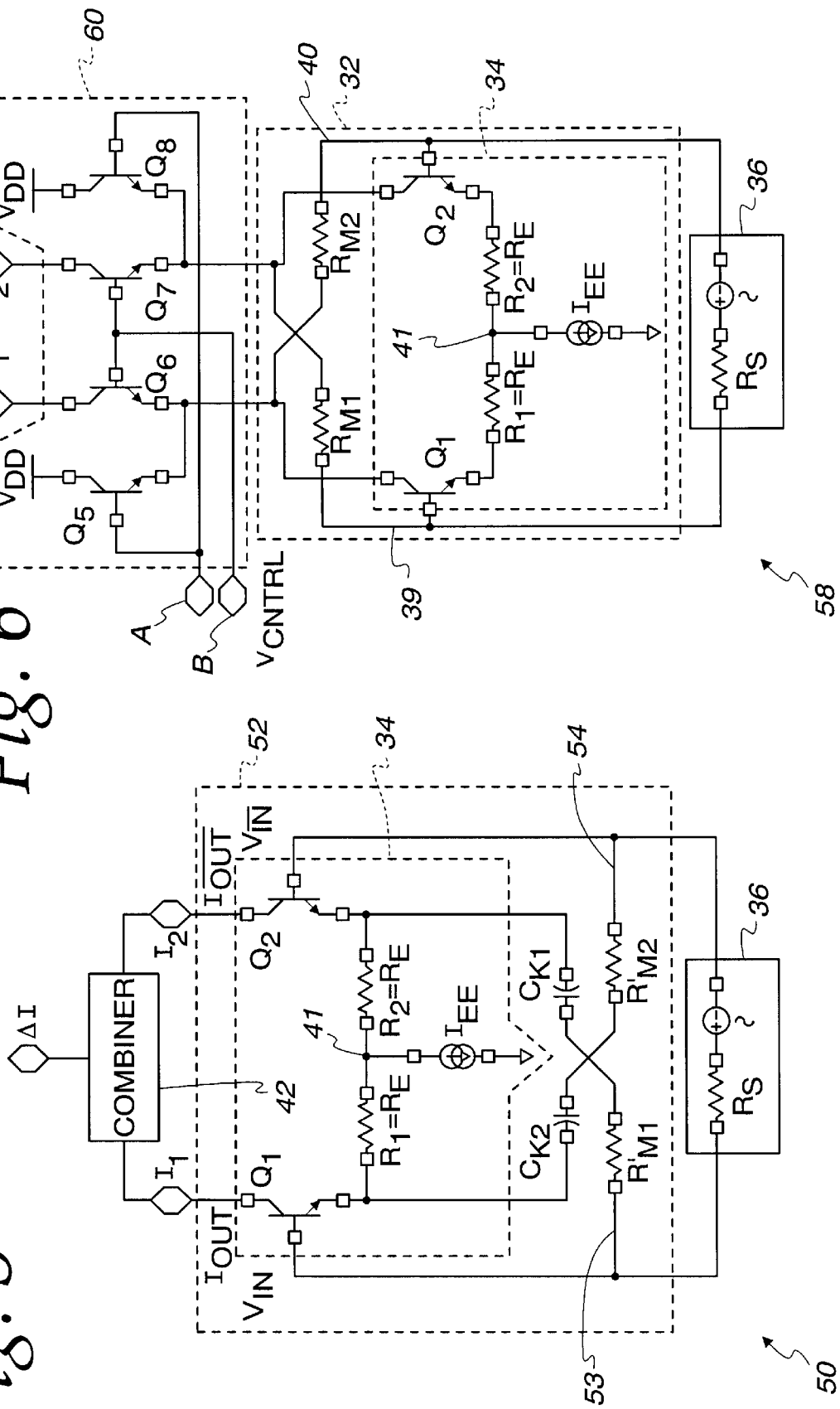
FIG. 5 illustrates an alternative embodiment of the amplifier circuit according to the present invention.

FIG. 5 illustrates a further embodiment of the inventive amplifier topology, shown generally at 50. The inventive amplifier 50 includes an amplifier circuit 52 including the $G_M$ cell 34 (differential amplifier) previously described with respect to FIG. 3. The amplifier 52 includes a first feedforward circuit 53 including a series connected resistor $R_{M1}$' and capacitor $C_{K1}$ connected between node $V_{IN}$ and the emitter of transistor $Q_2$. A second feedforward circuit 54 including a series connected resistor $R_{M2}$' and capacitor $C_{K2}$ is connected between the node $V_{\overline{IN}}$ and the emitter of transistor $Q_1$. Since the output signal is taken directly from the collectors of transistors $Q_1$ and $Q_2$ at the nodes $I_{OUT}$, $I_{\overline{OUT}}$, the current collector circuit 38 shown in FIG. 3 is not necessary. Operation of the inventive amplifier circuit 50 is as follows.

The capacitors $C_{K1}$ and $C_{K2}$ provide DC decoupling of the DC base-emitter voltage drop associated with transistors $Q_1$ and $Q_2$, and do not influence the behavior of the inventive amplifier circuit 50 for the AC signal provided by the source 36. Again, it is assumed that the AC signal out of the source 36 causes the voltage at node $V_{IN}$ to increase by $\Delta V/2$. The voltage at the node $V_{\overline{IN}}$ correspondingly decreases by $\Delta V/2$. If it is further assumed that the transistors $Q_1$ and $Q_2$ are ideal voltage followers such that their base-emitter voltages remain relatively constant as their base voltage varies, then the voltage change at the emitters of the transistors $Q_1$ and $Q_2$ is equal to the voltage change at the bases of the transistors $Q_1$ and $Q_2$ (except for the DC level shift due to the base-emitter voltage). Thus, as the voltage at the base of transistor $Q_1$ ($V_{IN}$) goes up by $\Delta V/2$, the voltage at the emitter of transistor $Q_1$ also increases by $\Delta V/2$. Similarly, as the voltage at the base of transistor $Q_2$ ($V_{\overline{IN}}$) goes down by $\Delta V/2$, the voltage at the emitter of transistor $Q_2$ also decreases by $\Delta V/2$. Accordingly, a voltage change of $\Delta V$ between the bases of transistors $Q_1$ and $Q_2$ corresponds to a voltage change of $\Delta V$ between the emitters of transistors $Q_1$ and $Q_2$. If a resistor (assume $R_{M1}$') is connected between the base of one transistor ($Q_1$) and the emitter of the other transistor ($Q_2$), the current flowing through the resistor $R_{M1}$' will be $\Delta V/R_{M1}$'. If $R_{M1}$' is chosen such that $R_{M1}$'=$R_M$=$R_S$, the input current will be $\Delta V/R_M$, which is the same input current as in the resistively shunt matched amplifier of FIG. 1 (with $R_M$ connected). For symmetry reasons, the same resistor (assume $R_{M2}$', where $R_{M2}$'=$R_M$=$R_S$) has to be connected between the base of transistor ($Q_2$) and the emitter of transistor ($Q_1$). Since the voltage difference across the resistors $R_{M1}$' and $R_{M2}$' is the same as the voltage difference across resistor $R_M$ in FIG. 1, the input impedance $R_{IN}$ of the $G_M$ cell 34, as seen by the source 36, is unchanged with respect to FIG. 1 (with $R_M$ connected). Accordingly, the preferred values for $R_{M1}$' and $R_{M2}$' to achieve power-matching are $R_{M1}$'=$R_{M2}$'=$R_S$.

Current flowing out of the source 36 flows through resistor $R_{M1}$' and into the emitter of transistor $Q_2$. Since transistor $Q_2$ is assumed ideal with unity gain, that same current will show up at the output node $I_{\overline{Out}}$ of the $G_M$ cell 34 (collector of transistor $Q_2$). The same holds true for the current flowing through resistor $R_{M2}$' and into the emitter of transistor $Q_1$. This results in an increase in output currents $I_1$ and $I_2$ at output nodes $I_{OUT}$ and $I_{\overline{OUT}}$, and provided the noise remains relatively constant, results in an increase in the signal-to-noise ratio at the output $(S/N)_{OUT}$ of the amplifier circuit 52, thus decreasing the respective noise factor F and noise figure NF associated with the amplifier circuit 52.

The amplifier circuit 52 also benefits from noise cancellation of the noise contributed by the matching resistors $R_{M1}$' and $R_{M2}$'. Assume that there is a noise voltage source vn connected in series with $R_{M1}$'. For the power-matched condition, the values of $R_{M1}$' and $R_{M2}$' will be equal to $R_S$. An instantaneous noise current equal to $v_n/2R_S$ will flow in the $R_{M1}$'-$R_{M2}$'-source 36 loop, resulting in a differential instantaneous noise output current at output nodes $I_{OUT}$ and $I_{\overline{OUT}}$ equal to $i_{n1}=v_n/R_S$. The instantaneous noise current flowing through the source 36 also causes a voltage drop equal to $v_n/2$ across the source resistance $R_S$. This voltage drop appears across the input nodes $V_{IN}$, $V_{\overline{IN}}$ of the $G_M$ cell 34, resulting in a second instantaneous differential noise output current at output nodes $I_{OUT}$ and $I_{\overline{OUT}}$ equal to $i_{n2}=(-v_n/2)(1/R_E+2/R_S)$. The total instantaneous noise output current due to the noise contribution of resistor $R_{M1}$' will be the sum of the two components $i_n=i_{n1}+i_{n2}=-v_n/R_E$. Unfortunately, the noise cancellation is only partial. The same holds true for the noise contribution of resistor $R_{M2}$'.

The resistors $R_{M1}$' and $R_{M2}$' also provide positive feedback within the $G_M$ cell 34, and accordingly, common mode stability must be ensured. In the amplifier circuit 52, the feedback paths are from the emitters to the bases of the transistors $Q_1$ and $Q_2$, respectively. If the transistors $Q_1$ and $Q_2$ are ideal voltage followers, the common mode gain would be exactly equal to one, and common mode stability would be marginal. Since the transistors $Q_1$ and $Q_2$ always have a finite transconductance, the voltage swing at the emitter nodes of the transistors $Q_1$ and $Q_2$ will always be smaller than the voltage swing at the base nodes of the transistors $Q_1$ and $Q_2$, resulting in a common mode gain of less than one and ensuring stability.

Figure 6:
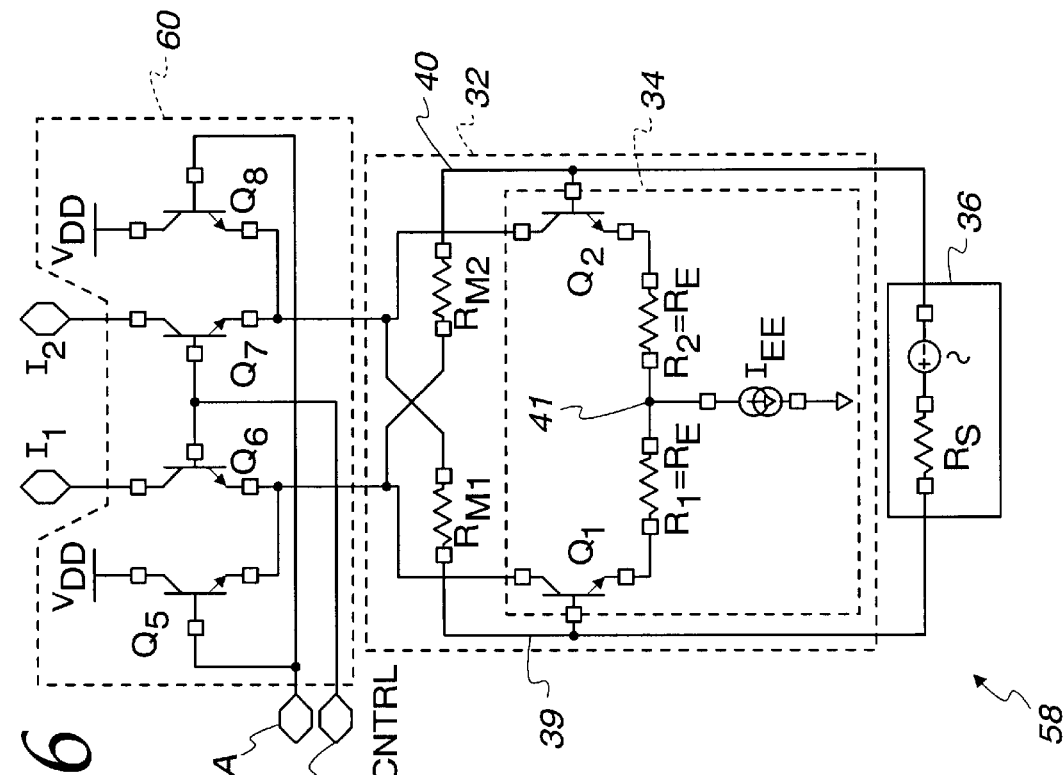
FIG. 6 illustrates an application of the inventive amplifier circuit shown in FIG. 3 utilized in a voltage controllable amplifier.

The inventive amplifier circuits described above have various applications. For instance, FIG. 6 illustrates the inventive amplifier circuit 32 shown in FIG. 3 utilized in a voltage controllable amplifier 58. Basically, the current collector circuit 38 of FIG. 3 has been replaced with a conventional current switching circuit 60 including transistors $Q_5$, $Q_6$, $Q_7$ and $Q_8$ controlled by a control voltage $V_{CNTRL}$. The extension of the current switching circuit 60 does not impact the impedance matching behavior as previously described. Depending upon the respective values of the control voltage $V_{CNTRL}$ at nodes A and B, more current can be steered through transistors $Q_6$ and $Q_7$ to the outputs $I_1$ and $I_2$, or more current can be steered through the transistors $Q_5$ and $Q_8$ to $V_{DD}$, which is essentially an AC ground. Accordingly, by adjusting $V_{CNTRL}$, the amount of output current ($I_1$ and $I_2$), and hence the gain of the circuit, can be controlled.

Figure 7:
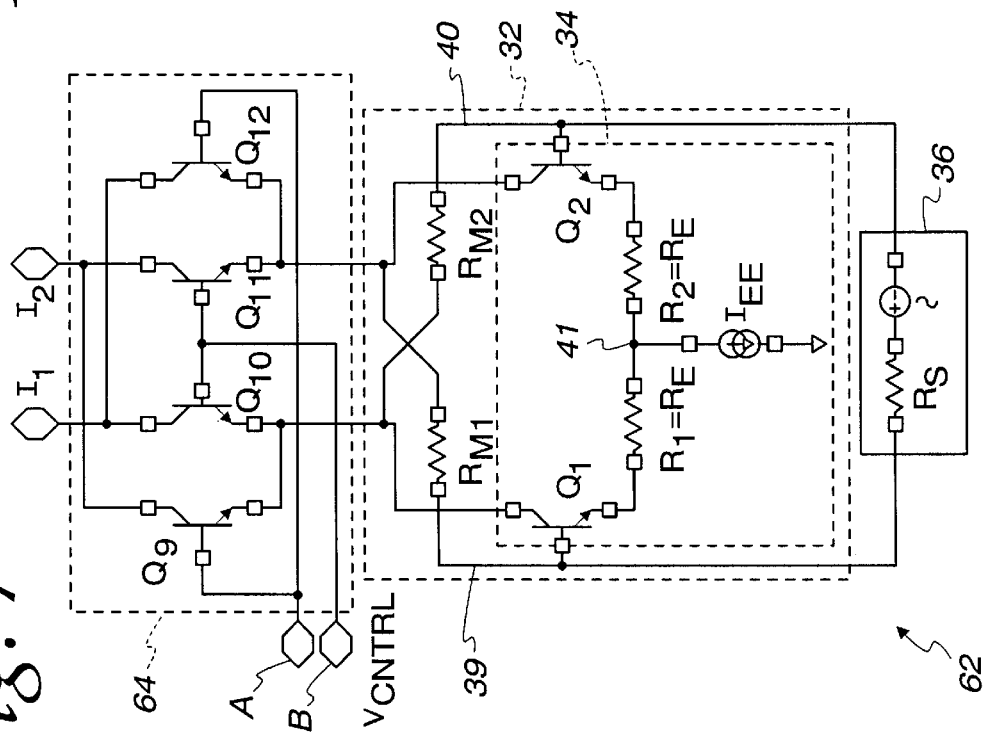
FIG. 7 illustrates the inventive amplifier circuit shown in FIG. 3 utilized in a switching mixer circuit.

FIG. 7 illustrates the inventive amplifier circuit 32 of FIG. 3 utilized in a switching mixer circuit 62. Basically, the current control circuit 38 of FIG. 3 has been replaced by a conventional switching mixer circuit 64, commonly known as a Gilbert Mixer, including transistors $Q_9$, $Q_{10}$, $Q_{11}$ and $Q_{12}$ controlled by a control voltage $V_{CNTRL}$. The extension of the switching mixer 64 does not impact the impedance matching behavior as previously described. Switching mixers, such as the illustrated Gilbert Mixer, are used for frequency translation of RF (Radio Frequency) signals in receivers (downconversion operation) and transmitters (upconversion mixers). The switching mixer 64 essentially shifts the frequency of the incoming signal. The shift in frequency is equal to the frequency of the incoming signal plus or minus the frequency of the AC control voltage $V_{CNTRL}$ applied at nodes A and B. For example, if the signal out of the amplifier circuit 32 was at 900 MHz, and the control voltage $V_{CNTRL}$ was at 800 MHz, the resultant output signal $I_1, I_2$ would be at 100 MHz, but would contain the same information as the 900 MHz signal.

Figure 8:
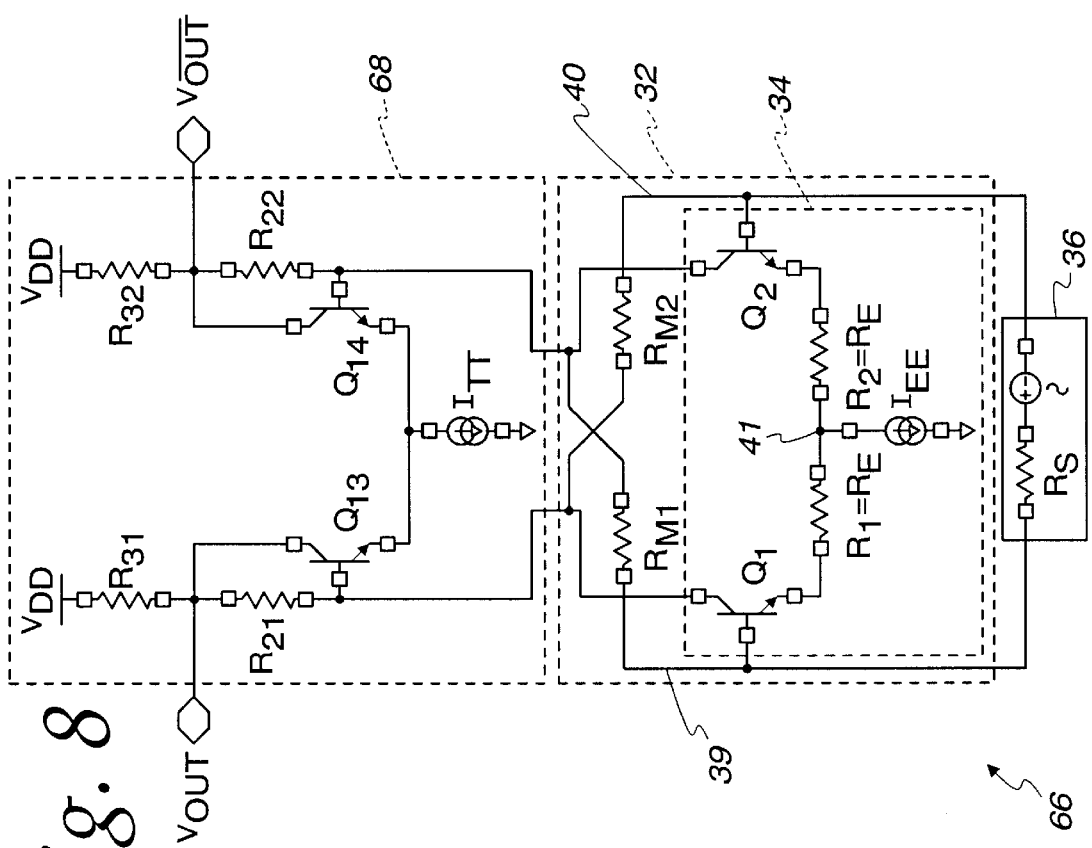
FIG. 8 illustrates the inventive amplifier circuit shown in FIG. 3 utilized in a power-to-voltage converter circuit.

FIG. 8 illustrates the inventive amplifier circuit 32 of FIG. 3 utilized in a power-to-voltage converter circuit 66. The current collector circuit 38 of FIG. 3 has been replaced with a conventional differential transimpedance circuit 68 including transistors $Q_{13}$ and $Q_{14}$, resistors $R_{21}$, $R_{22}$, $R_{31}$ and $R_{32}$ and a current source $I_{TT}$. Provided resistors $R_{31}$ and $R_{32}$ are large, the differential output voltage at $V_{OUT}$ and $V_{\overline{OUT}}$ is the differential input current multiplied by $R_2$, where $R_2 = R_{21} = R_{22}$. The main advantage of the circuit 66 is that as a result of the negative feedback loop around transistors $Q_{13}$ and $Q_{14}$, via resistors $R_{21}$ and $R_{22}$, respectively, the output impedance of the transimpedance circuit 68 is relatively low. Further, the input impedance of the circuit 68 is relatively low and of the same order of magnitude as the input impedance of the current collector circuit of FIG. 3. As a result, the circuit 66 implements a true power-to-voltage converter.

Figure 9:
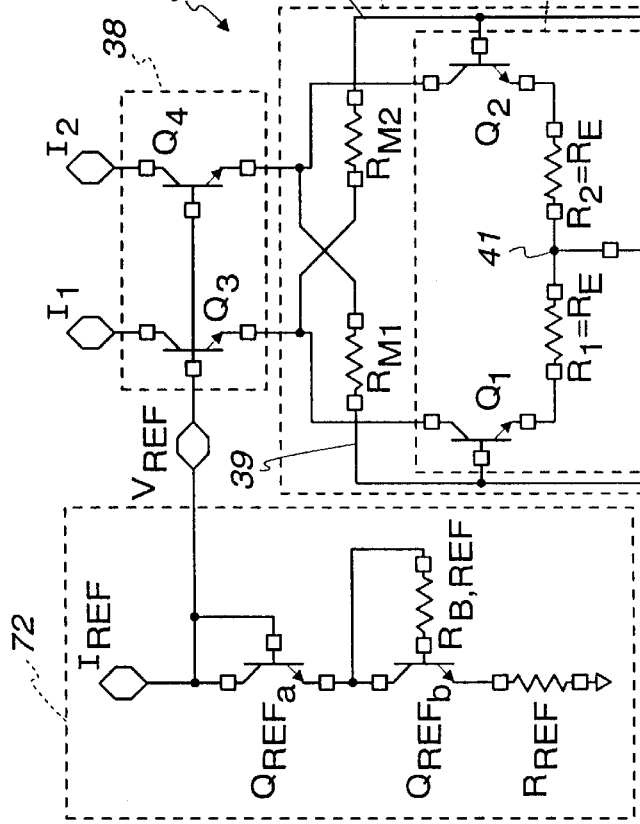
FIG. 9 illustrates the inventive amplifier topology shown in FIG. 3 implemented in a first type of quasi-differential circuit.

FIG. 9 illustrates the inventive amplifier topology 30 of FIG. 3 implemented in a first type of quasi-differential circuit, shown generally at 70. The current source $I_{EE}$ has been removed from the $G_M$ cell 34, and the node 41 common to resistors $R_1$ and $R_2$ is connected directly to ground. This saves the amount of voltage (approximately 0.5 volts) that is needed to implement the current source $I_{EE}$. The removal of the current source $I_{EE}$ necessitates the addition of the biasing circuit 72 connected to the node $V_{REF}$, which is a common biasing circuit to determine the DC bias current of an amplifier. Essentially, the base-emitter voltage drops on transistors $Q_3$ and $Q_4$ mirror the base-emitter voltage drop on transistor $Q_{REFa}$; the base-emitter voltage drops on transistors $Q_1$ and $Q_2$ mirror the base-emitter voltage drop on transistor $Q_{REFb}$; and the voltage drops across resistors $R_1$ and $R_2$ mirror the voltage drop across resistor $R_{REF}$ which is equal to $I_{REF} R_{REF}$. In this manner, the input current $I_{REF}$ defines the DC bias current flowing through each symmetrical side of the inventive amplifier topology 30.

Figure 10:
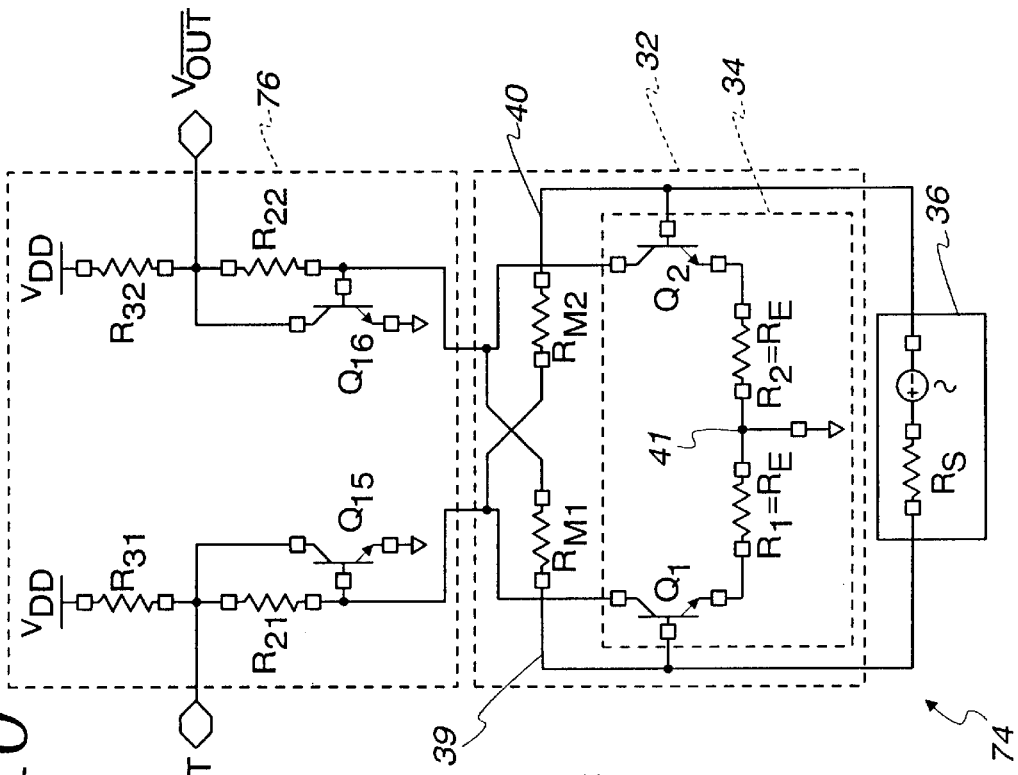
FIG. 10 illustrates the inventive amplifier circuit shown in FIG. 3 implemented in a second type of quasi-differential circuit.

FIG. 10 illustrates the inventive amplifier circuit 32 of FIG. 3 implemented in a second type quasi-differential circuit, shown generally at 74. The current collector 38 has been replaced with a conventional quasi-differential transimpedance circuit 76 including transistors $Q_{15}$ and $Q_{16}$, and resistors $R_{21}$, $R_{22}$, $R_{31}$ and $R_{32}$. Also, the current source $I_{EE}$ has been removed from the $G_M$ cell 34. The circuit 74 is suited for very low supply voltages and can easily operate at 1.2 volts, and even as low as 1.0 volt, and still achieve considerable gain. A further advantage of the circuit 74 is that no biasing network is necessary; the circuit 74 is completely self-biased. The DC bias current is defined by the relative sizes of transistors $Q_2, Q_{16}$ and $Q_1, Q_{15}$ and resistors $R_{31}$ and $R_{32}$.

Figure 11:
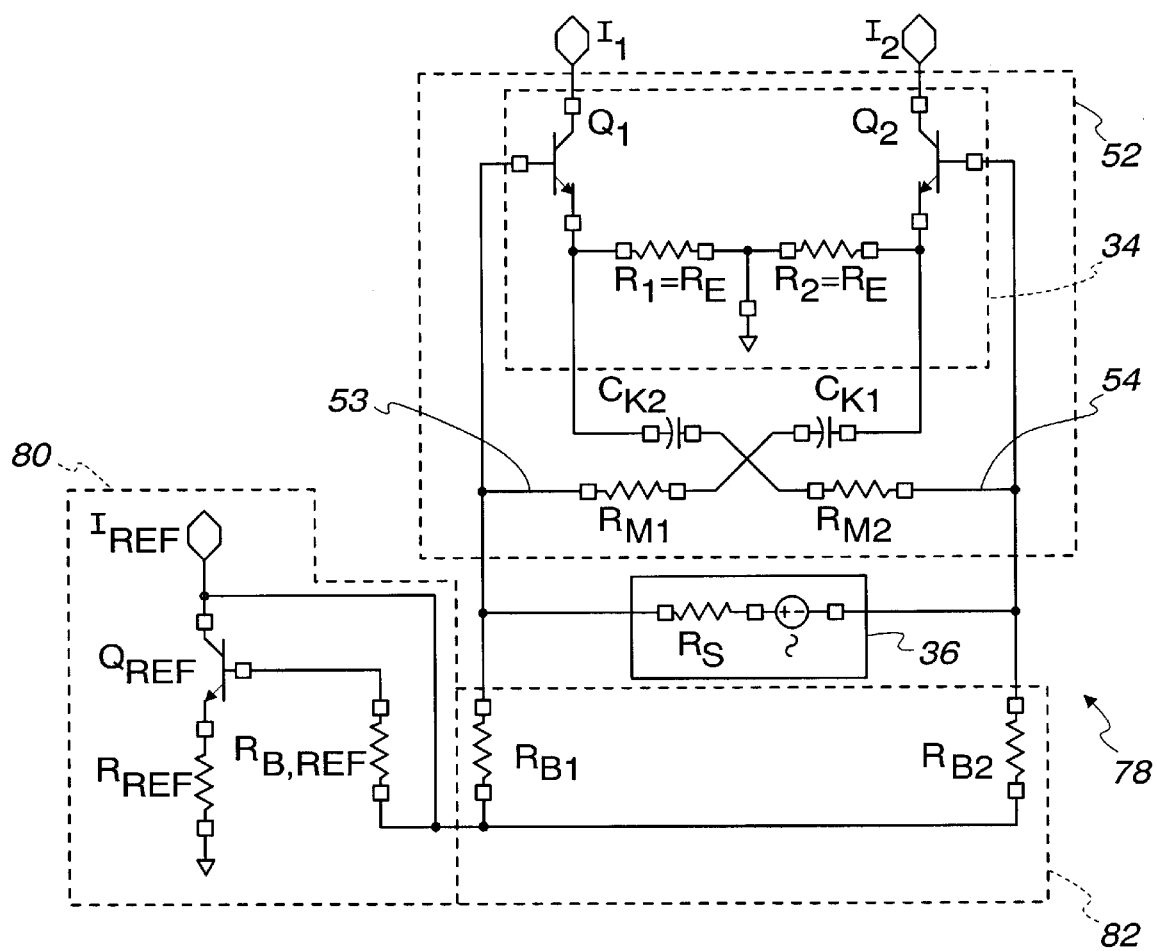
FIG. 11 illustrates the inventive amplifier circuit shown in FIG. 5 implemented in a third type of quasi-differential circuit.

FIG. 11 illustrates the inventive amplifier circuit 52 of FIG. 5 implemented in a third type of quasi-differential circuit, shown generally at 78. As in the previous quasi-differential implementations (FIGS. 9 and 10), the current source $I_{EE}$ has been removed from the $G_M$ cell 34. Accordingly, the circuit 78 includes a conventional DC biasing circuit 80. The biasing circuit 80 is structurally similar to the biasing circuit 72 shown in FIG. 9, however, the base biasing voltage of the $G_M$ cell 34 in FIG. 11 has to be supplied through a biasing network 82, i.e., resistors. The biasing resistors must be large enough to prevent appreciable source signal from being lost into them. Any signal or current flowing into the biasing resistors will have a direct negative impact on the noise figure of the amplifier circuit 52.

In FIG. 11, the biasing network 82 includes resistors $RB_1$ and $RB_2$. Resistor $RB_{,REF}'$ is a replica of $RB_1$ and $RB_2$, scaled by a mirror ratio M that defines the biasing currents in the devices to be equal to $M_{REF}'$. This is a common biasing scheme and accordingly, a detailed description is not necessitated. The circuit 78 is well suited for low voltage operation down to 1.0 volt.

While the invention has been described with particular reference to the drawings, it should be understood that various modifications could be made without departing from the spirit and scope of the present invention.

What is claimed is:

1. In a communication transceiver receiving a signal from a signal source defined by a source impedance between first and second nodes, an amplifier having an input impedance matched to the source impedance comprising:

a transconductance cell comprising first and second transistors connected to the first and second nodes, respectively, the first and second transistors receiving the signal from the signal source and developing a modified version of the signal as an output current signal at first and second output terminals, respectively;

a first impedance circuit connected between the second node and the first transistor to define a first feedforward loop, the first impedance circuit having a first impedance related to the input impedance; and a second impedance circuit connected between the first node and the second transistor to define a second feedforward loop, the second impedance circuit having a second impedance related to the input impedance.

2. In a communication transceiver receiving a signal from a signal source defined by a source impedance between first and second nodes, an amplifier having an input impedance matched to the source impedance comprising:

a transconductance cell comprising first and second transistors connected to the first and second nodes, respectively, the first and second transistors receiving the signal from the signal source and developing a modified version of the signal as an output current signal at first and second output terminals, respectively;

a first impedance circuit connected between the second node and the first transistor to define a first feedforward loop, the first impedance circuit having a first impedance related to the input impedance; and a second impedance circuit connected between the first node and the second transistor to define a second feedforward loop, the second impedance circuit having a second impedance related to the input impedance, wherein the first and second transistors each include control, output and supply elements, the control elements of the first and second transistors connected to the first and second nodes, respectively, and the output element of the first and second transistors corresponding to the first and second output terminals, respectively, wherein the first impedance circuit is connected between the second node and the output element of the first transistor, and wherein the second impedance circuit is connected between the first node and the output element of the second transistor.

3. The amplifier of claim 2, wherein the source impedance comprises a source resistance $R_S$,
the first impedance comprises a first resistance $R_1$, and
the second impedance comprises a second resistance $R_2$.

4. The amplifier of claim 3, wherein $R_1=R_2$.

5. The amplifier of claim 2, wherein the first and second transistors comprise bipolar junction transistors having base, collector and emitter elements corresponding to the control, output and supply elements, respectively.

6. The amplifier of claim 2, wherein the first and second transistors comprise field effect transistors having gate, drain and source elements corresponding to the control, output and supply elements, respectively.

7. The amplifier of claim 2, further comprising a current collector circuit connected to the first and second output terminals, the current collector circuit combining the output current signal at the first and second output terminals with current signals from the first and second impedance circuits, respectively, and developing a combined output current signal at respective output terminals thereof.

8. The amplifier of claim 7, wherein the current collector circuit comprises third and fourth transistors each having control, output and supply elements, the supply elements of the third and fourth transistors connected to the first and second output terminals, respectively, the third and fourth transistors developing the combined output current signal at the output elements thereof.

9. The amplifier of claim 8, wherein the third and fourth transistors each have unity gain.

10. In a communication transceiver receiving a signal from a signal source defined by a source impedance between first and second nodes, an amplifier having an input impedance matched to the source impedance comprising:

a transconductance cell comprising first and second transistors connected to the first and second nodes, respectively, the first and second transistors receiving the signal from the signal source and developing a modified version of the signal as an output current signal at first and second output terminals, respectively;

a first impedance circuit connected between the second node and the first transistor to define a first feedforward loop, the first impedance circuit having a first impedance related to the input impedance; and a second impedance circuit connected between the first node and the second transistor to define a second feedforward loop, the second impedance circuit having a second impedance related to the input impedance, wherein the first and second transistors each include control, output and supply elements, the control elements of the first and second transistors connected to the first and second nodes, respectively, and the output elements of the first and second transistors corresponding to the first and second output terminals, respectively, wherein the first impedance circuit is connected between the second node and the supply element of the first transistor, and wherein the second impedance circuit is connected between the first node and the supply element of the second transistor.

11. The amplifier of claim 10, wherein
the source impedance comprises a source resistance $R_S$,
the first impedance comprises a first resistance $R_1$, and
the second impedance comprises a second resistance $R_2$.

12. The amplifier of claim 10, wherein the first impedance circuit includes a first DC block capacitor, and wherein the second impedance circuit includes a second DC block capacitor.

13. The amplifier of claim 10, wherein the first and second transistors comprise bipolar junction transistors having base, collector and emitter elements corresponding to the control, output and supply elements, respectively.

14. The amplifier of claim 10, wherein the first and second transistors comprise field effect transistors having gate, drain and source elements corresponding to the control, output and supply elements, respectively.

15. The amplifier of claim 1, wherein the transconductance cell comprises a differential amplifier receiving the signal from the signal source and developing a differential output current signal at the first and second output terminals.

16. In a communication transceiver receiving a signal from a signal source defined by a source impedance between first and second nodes, an amplifier having an input impedance matched to the source impedance comprising:

a transconductance cell having first and second input terminals connected to the first and second nodes, respectively, said transconductance cell receiving the signal from the signal source and developing a modified version of the signal received at the first and second input terminals as an output current signal at first and second output terminals, respectively;

a first impedance circuit connected between the second node and the first output terminal to define a first feedforward loop, the first impedance circuit having a first impedance related to the input impedance; and a second impedance circuit connected between the first node and the second output terminal to define a second feedforward loop, the second impedance circuit having a second impedance related to the input impedance.

17. The amplifier of claim 16, wherein
the source impedance comprises a source resistance $R_S$,
the first impedance comprises a first resistor $R_1$, and
the second impedance comprises a second resistor $R_2$.

18. The amplifier of claim 17, wherein $R_1=R_2$.

19. The amplifier of claim 16, wherein the transconductance cell comprises first and second transistors connected between the first and second input and output terminals, respectively, the first and second transistors receiving the signal from the signal source and developing a modified version of the signal received at the first and second input terminals as an output current signal at the first and second output terminals, respectively.

20. The amplifier of claim 19, wherein the first and second transistors comprise bipolar junction transistors.

21. The amplifier of claim 19, wherein the first and second transistors comprise field effect transistors.

22. The amplifier of claim 16, wherein the transconductance cell comprises a differential amplifier receiving the signal at the first and second input terminals and developing a differential output current signal at the first and second output terminals.

23. The amplifier of claim 16, further comprising a current collector circuit connected to the first and second output terminals, the current collector circuit combining the output current signal at the first and second output terminals with current signals from the first and second impedance circuits, respectively, and developing a combined output current signal at respective output terminals thereof.

24. The amplifier of claim 23, wherein the current collector circuit comprises third and fourth transistors each having control, output and supply elements, the supply elements of the third and fourth transistors connected to the first and second output terminals, respectively, the third and fourth transistors developing the combined output current signal at the output elements thereof.

25. The amplifier of claim 24, wherein the third and fourth transistors each have unity gain.

* * * * *